United States Patent [19]
Ting et al.

[11] Patent Number: 5,837,081
[45] Date of Patent: *Nov. 17, 1998

[54] METHOD FOR MAKING A CARBON-CARBON COMPOSITE

[75] Inventors: Jyh-Ming Ting, Fairborn; Max Laverne Lake, Yellow Springs, both of Ohio

[73] Assignee: Applied Sciences, Inc., Cedarville, Ohio

[ * ] Notice: The term of this patent shall not extend beyond the expiration date of Pat. No. 5,389,400.

[21] Appl. No.: 614,993

[22] Filed: Mar. 13, 1996

Related U.S. Application Data

[60] Continuation-in-part of Ser. No. 332,903, Nov. 1, 1994, Pat. No. 5,604,037, which is a division of Ser. No. 44,223, Apr. 7, 1993, Pat. No. 5,389,400.

[51] Int. Cl.$^6$ .............................. B32B 31/12; C23C 16/26
[52] U.S. Cl. ........................ 156/89.26; 264/81; 427/228; 427/249; 427/255.1
[58] Field of Search .................... 156/89, 62.4, 89.25, 156/89.26; 264/29.1, 60, 81; 427/228, 249, 255.1, 113, 122, 314, 372.2; 423/447.3

[56] References Cited

U.S. PATENT DOCUMENTS

| | | |
|---|---|---|
| 3,895,084 | 7/1975 | Bauer . |
| 3,949,062 | 4/1976 | Vereschagin et al. . |
| 4,122,636 | 10/1978 | Roy et al. . |
| 4,396,663 | 8/1983 | Mitchell et al. . |
| 4,437,962 | 3/1984 | Banks . |
| 4,490,201 | 12/1984 | Leeds . |
| 4,504,519 | 3/1985 | Zelez . |
| 4,770,867 | 9/1988 | Coulon et al. ........................ 423/447.3 |
| 4,830,702 | 5/1989 | Singh et al. . |
| 4,859,493 | 8/1989 | Lemelson . |
| 4,876,078 | 10/1989 | Arakawa et al. ..................... 423/447.3 |
| 4,900,483 | 2/1990 | Witzke et al. ................... 423/447.3 X |
| 4,938,940 | 7/1990 | Hirose et al. . |
| 4,940,015 | 7/1990 | Kobashi et al. . |
| 4,944,904 | 7/1990 | Singh et al. . |
| 4,958,590 | 9/1990 | Goforth . |
| 4,961,958 | 10/1990 | Desphandey et al. . |
| 5,008,737 | 4/1991 | Burnham et al. . |
| 5,093,156 | 3/1992 | Uemura et al. .......................... 427/249 |
| 5,096,352 | 3/1992 | Lemelson . |
| 5,102,647 | 4/1992 | Yamada et al. ....................... 423/447.3 |
| 5,126,206 | 6/1992 | Garg et al. . |
| 5,165,909 | 11/1992 | Tennent et al. ....................... 423/447.3 |
| 5,203,924 | 4/1993 | Mitani et al. . |
| 5,204,167 | 4/1993 | Saijo et al. . |
| 5,217,657 | 6/1993 | Engle ................................. 427/228 X |
| 5,227,142 | 7/1993 | Murai et al. ...................... 423/447.3 X |
| 5,389,400 | 2/1995 | Ting et al. .............................. 427/249 |
| 5,413,866 | 5/1995 | Baker et al. ..................... 423/447.3 X |
| 5,597,611 | 1/1997 | Lennox et al. .......................... 427/113 |

OTHER PUBLICATIONS

R. Messier, "The Quest for Diamond Coatings," *J. of Metals,* Sep. 1987, pp. 8–11.

W. Zhu et al, "Graphite Formation in CVD Diamond Film Deposition," 35th Nat. Symposium of American Vacuum Society, Atlanta, Ga., Oct. 1988, pp. 1–22.

R. Messier et al, "From Diamond–like Carbon to Diamond Coating," presented at ICMC, San Diego, 1987, pp. 1–11.

A.R. Badzian et al, Crystallization of Diamond Crystals and Films by Microwave Assisted CVD (Part II) Materials Research Bulletin, vol. 23, pp. 531–548, 1988.

A. Badzian et al, "Vapor Deposition Synthesis of Diamond Films,"SPIE vol. 683, Infrared and Optical Transmitting Materials, Aug. 1986, pp. 127–138.

B.V. Deryagin et al, "Epitaxial Synthesis of Diamond in the Metastable Region,"Russian Chemical Reviews, 39 (9), 1970, pp. 783–788.

R.C. DeVries, "Synthesis of Diamond under Metastable Conditions," Annual Rev. Assisted CVD Material Sci., 1987, 17:161–187.

Geis et al, "Diamond Film Semiconductors," *Sci. American,* Oct. 1992, pp. 84–89.

Chang et al, "Diamond Crystal Growth by Plasma Chemical Vapor Deposition," *J. Appl. Phys.,* 63 (5), Mar. 1988.

A.R. Badzian et al, "Diamond Thin Films Prepared by Plasma Chemical Vapor Deposition Processes," Mat. Research Soc. Meeting, Jun. 1987, vol. 15, pp. 63–77, Les Addition de Physique, Paris.

J.M. Ting et al., "Diamond–infiltrated carbon–carbon composites," Diamond and Related Materials, 2(1993) 1069–1077.

M.L. Lake et al., "Vapor grown carbon fiber for space thermal management systems," 35th International SAMPE Symposium, pp. 960–969, Apr. 1990.

A.U. Ahmed et al., "Electrical resistivity (4K to 2100K) of annealed vapor grown carbon fibers," Applied Physics Communications, 7(3), pp. 135–155, 1987.

M.L. Lake et al., "Vapor grown carbon fibers: properties and applications." Struct Carbons Annual Conf Mater Technol, pp. 55–63, 1992.

G.G. Tibbetts et al., "Carbon fibers grown from the vapor phase: A novel material," SAMPE Journal, 22(5), Sep–Oct. 1986, 30.

*Primary Examiner*—Curtis Mayes
*Attorney, Agent, or Firm*—Killworth, Gottman, Hagan & Schaeff L.L.P.

[57] ABSTRACT

A carbon-carbon composite is provided comprising a preform containing interwoven mats of graphitized vapor grown carbon fibers. The mat comprises semi-aligned, semi-continuous vapor grown carbon fibers which have been interwoven in situ during growth. The preferred method of producing the carbon-carbon composite includes the steps of densifying the preform by depositing pyrolytic carbon into the interstices of the preform by chemical vapor infiltration or pitch infiltration. The resulting carbon-carbon composite has a thermal conductivity of between about 900 W/m-K and 1000 W/m-K and is useful as a component in electronic devices, aircraft, spacecraft, and other thermal management applications.

11 Claims, 2 Drawing Sheets

METHOD FOR MAKING A CARBON-CARBON COMPOSITE

CROSS REFERENCE TO RELATED APPLICATIONS

The present application is a continuation-in-part of U.S. application Ser. No. 08/332,903 filed Nov. 1, 1994, now U.S. Pat. No. 5,604,037, which is a division of U.S. Ser. No. 08/044,223 filed Apr. 7, 1993, now U.S. Pat. No. 5,389,400.

GOVERNMENT RIGHTS

This invention was made with Government support under Contract No. F29601-93-C-0165 awarded by the U.S. Air Force Systems Command. The Government has certain rights in the invention.

BACKGROUND OF THE INVENTION

The present invention relates to a carbon-carbon composite useful in thermal management applications, and to a method for making such a composite. More particularly, the present invention relates to a carbon-carbon composite having high thermal conductivity formed from a preform comprised of interwoven mats of graphitized vapor grown carbon fibers.

In recent years, the desire to use composites in thermal management applications has dramatically increased. For example, carbon-carbon composites are particularly desirable for use in aircraft and spacecraft thermal management due to the extremely high mass-normalized thermal conductivity of carbon-carbon. Carbon-carbon composites are also desirable for use as a plasma facing material in fusion reactors due to their high temperature properties and low mass number.

Thermal management problems which limit reliability and performance in more advanced electronic systems for spacecraft, aircraft and supercomputers may present other opportunities for the use of carbon-carbon composites. Ongoing improvements to heat sink materials and other components in thermal management must be made in order to maintain high-power, high-density electronic devices.

Many components for thermal management applications have been produced using composites comprised of fibers, fiber bundles, and mechanically-woven fiber bundles of carbon and other elements; however, such composites typically exhibit a thermal conductivity of less than 300 W/m-K. Carbon-carbon composites used in thermal management applications typically utilize ex-pitch fibers and/or ex-PAN fibers as reinforcements. However, such carbon-carbon composites offer limited improvement in thermal conductivity over traditional monolithic materials such as aluminum and copper, even after numerous densification, carbonization and graphitization cycles are performed. In addition, due to the nature of the ex-pitch and ex-PAN fibers, such composites are expensive and time consuming to produce as mechanical processing of the fiber preforms is required.

More recently, vapor grown carbon fibers have been studied for use in thermal management applications. Vapor grown carbon fibers have a higher thermal conductivity than any other carbon fiber or metal and may be produced at a lower cost. Such fibers are grown through the pyrolysis of hydrocarbon gas in the presence of a metal catalyst and exhibit a high degree of graphitic perfection. However, while such fibers exhibit superior physical properties, they are typically grown in discontinuous form, thus, attempts to orient the fibers and place them into composite preforms prior to their use as reinforcements in a carbon-carbon composite have not been entirely successful. As a result, discontinuous vapor grown carbon fibers have not been widely used in composites as the weaving and placement of such fibers into preforms is time consuming and adds to production costs.

Accordingly, there is still a need in the art for improved carbon-carbon composites which exhibit high thermal conductivity for use in thermal management applications, and to carbon-carbon composites which may be produced in a cost-effective manner.

SUMMARY OF THE INVENTION

The present invention meets that need by providing a unique carbon-carbon composite which exhibits high thermal conductivity and which may be used in a variety of thermal management applications. The carbon-carbon composite is formed from a preform containing mats of graphitized vapor grown carbon fibers which have been interwoven in situ during growth, thus eliminating the use of individual discontinuous fibers which must be mechanically interwoven in a separate process step.

In accordance with one embodiment of the invention, a carbon-carbon composite is provided comprising a preform which contains interwoven mats of graphitized vapor grown carbon fibers. The preform further includes interstices therein in which pyrolytic carbon has been deposited. Preferably, the mats in the preform are comprised of semi-aligned, semi-continuous vapor grown carbon fibers which have been interwoven in situ during growth. The fibers are also preferably graphitized, i.e., they are heat treated at a temperature of about 2800° C. or higher to convert a portion of the carbon contained in the fibers to graphitic carbon.

Preferably, the room temperature thermal conductivity of the vapor grown carbon fiber mat of the present invention is about 1760 W/m-K, which results in a carbon-carbon composite having a thermal conductivity of between about 900 W/m-K and 1000 W/m-K.

A method of making the carbon-carbon composite is also provided which generally comprises the steps of providing a preform comprising interwoven mats of graphitized vapor grown carbon fibers and densifying the preform by depositing pyrolytic carbon into the interstices of the preform.

Preferably, the preform is densified by a chemical vapor infiltration (CVI) process which uses a mixture of hydrogen and hydrocarbon gases. The hydrocarbon gas preferably comprises at least 50% by volume of the mixture. The chemical vapor infiltration process is preferably carried out at a temperature of from about 1000° C. to about 1100° C., and at a pressure of from about 5 torr to about 100 torr.

In an alternative embodiment of the invention, the preform is densified by a pitch infiltration process in which molten pitch from coal tar or petroleum sources is impregnated into the fiber preform under heat and pressure. This process is followed by pyrolysis and subsequent re-impregnations until the pores between the fibers are filled to the point of sealing, all as is known in the art. See, for example, U.S. Pat. Nos. 4,490,201 and 4,396,663, the disclosures of which are hereby incorporated by reference.

The method of the present invention is cost-effective and efficient as the use of vapor grown carbon fiber mats eliminates the need to mechanically weave individual grown fibers into a mat prior to their use as reinforcements in a carbon composite. Further, the resulting carbon-carbon composite exhibits a higher thermal conductivity than conventional carbon-carbon composites. The carbon-carbon composite may be used as a component in many thermal management applications including aircraft, spacecraft, supercomputers, electronic devices, and fusion reactors.

Accordingly, it is a feature of the present invention to provide a carbon-carbon composite formed from interwoven vapor grown carbon fiber mats which exhibits high thermal conductivity. It is a further feature of the present invention to provide a cost-effective method of producing such a carbon-carbon composite. These, and other features and advantages of the invention will become apparent from the following detailed description, the accompanying figures, and the appended claims.

DETAILED DESCRIPTION OF THE PREFERRED EMBODIMENT

The carbon-carbon composite of the present invention provides many advantages over conventional carbon-carbon composites. The vapor grown carbon fiber mat of the present invention has a high thermal conductivity, which in turn results in a high thermal conductivity for the resulting carbon-carbon composite. In addition, the highly graphitic structure of the graphitized vapor grown carbon fibers in the mat results in a higher degree of graphitic perfection in the pyrolytic (matrix) carbon, which improves the thermal conductivity of the resulting composite as will be explained in greater detail below.

Further, while other carbon fibers are produced in discontinuous form and must be mechanically interwoven prior to use in a composite, the vapor grown carbon fiber mats produced in the present invention consist of semi-aligned, semi-continuous fibers which are interwoven in situ during growth, thus the mats of the present invention are essentially produced in a one-step process and do not require any further mechanical weaving prior to the making of composites. Accordingly, the carbon-carbon composite of the present invention may be produced at much lower cost than conventional carbon-carbon composites.

Figure 1A:
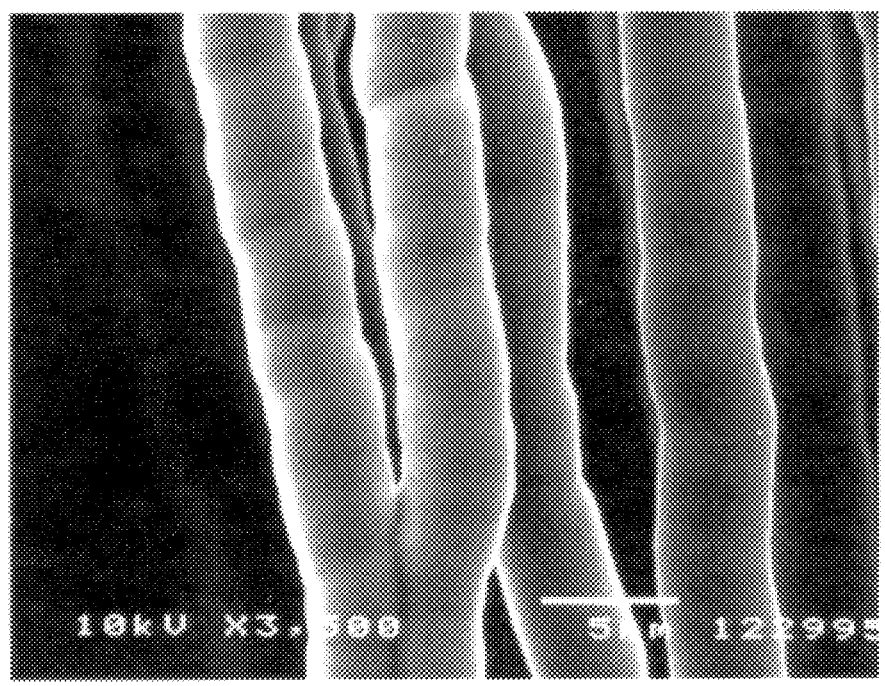
FIG. 1A is a photomicrograph illustrating a vapor grown carbon fiber mat in accordance with the present invention in which the fibers have a unidirectional orientation.
Figure 1B:
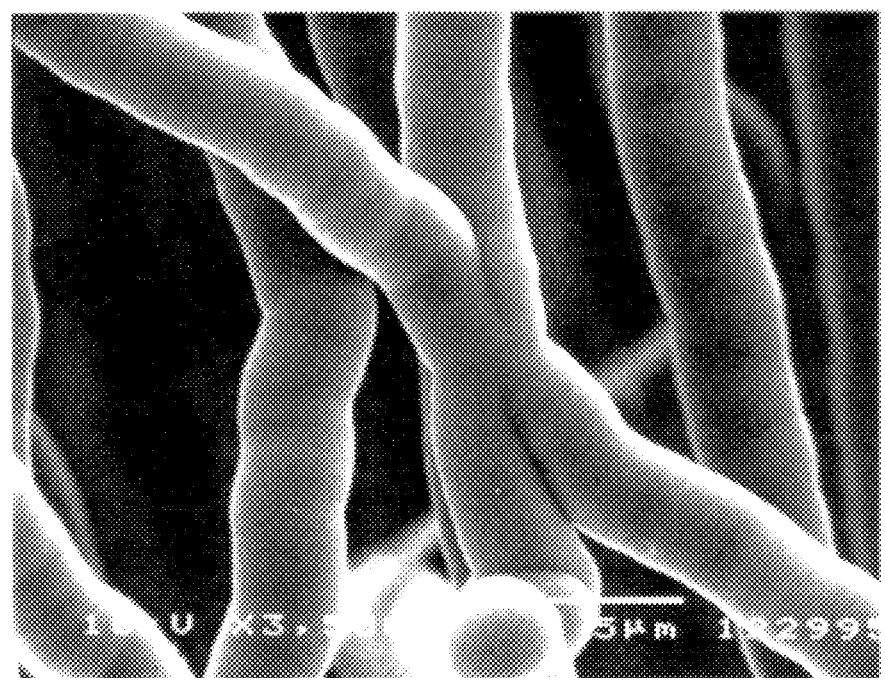
FIG. 1B is a photomicrograph illustrating a vapor grown carbon fiber mat including fibers having a two-directional orientation.
Figure 2:
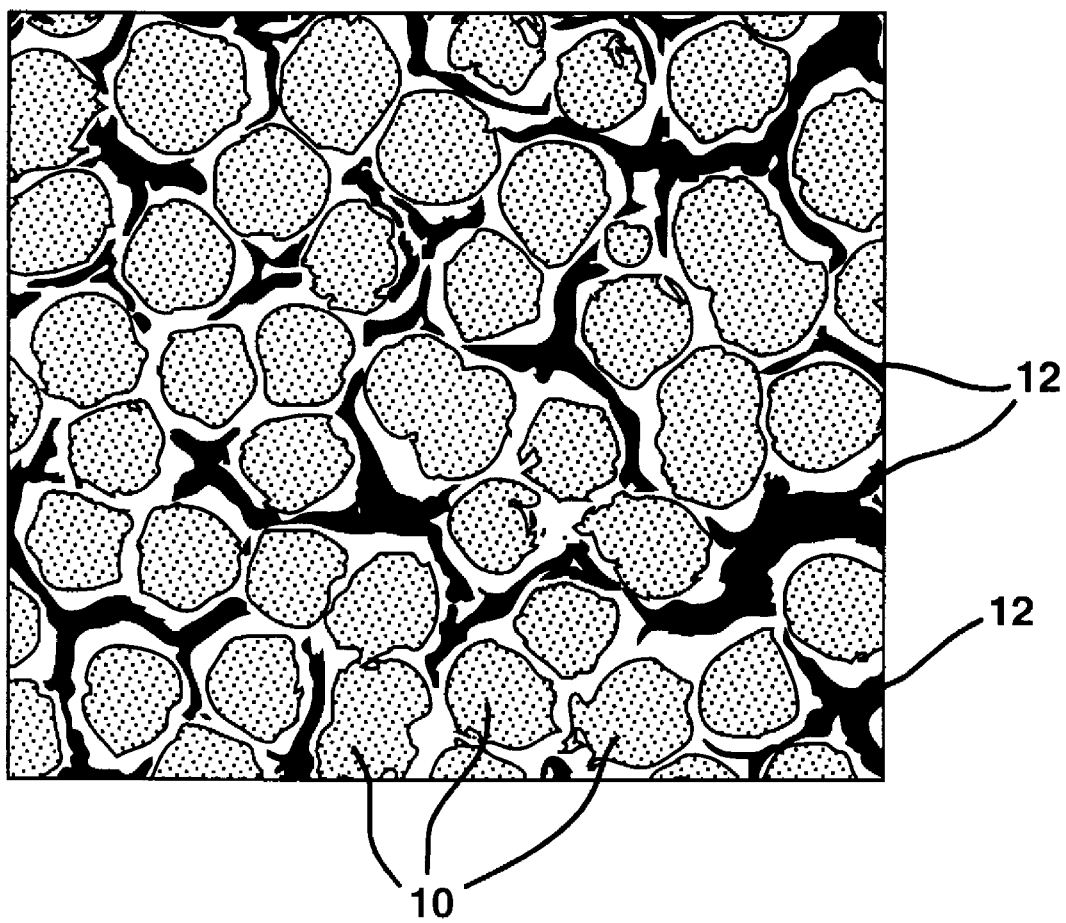
FIG. 2 is a cross-sectional view of the carbon-carbon composite of the present invention.

A cross-sectional view of the carbon-carbon composite of the present invention is illustrated in FIG. 2. As shown, the carbon-carbon-composite comprises a preform containing interwoven mats of graphitized vapor grown carbon fibers 10 with pyrolytic carbon 12 deposited between the fibers. The mats consist of semi-aligned, semi-continuous vapor grown carbon fibers containing junctions between individual fibers which are randomly spaced as illustrated in FIGS. 1A and 1B. In addition, the fibers may have unidirectional (FIG. 1A) or two-directional (FIG. 1B) orientation. The orientation and weaving of the fibers in the mats may be controlled by gas flow conditions during fiber growth as will be explained below.

It should be appreciated that the number of mats contained in the preform may vary depending on the desired dimensions and on the desired end use for the resulting composite. For example, the use of 12 to 15 mat plies results in a composite having a final thickness of about 15 mils. The dimensions of the individual mats may also be varied as desired.

The vapor grown carbon fiber mats are preferably grown on a substrate which has been previously seeded with iron particles. The substrate is placed in a reactor and a flowing gas mixture of methane and hydrogen is introduced at a temperature of about 1000° C. Some of the fibers intertwine during the growth process, which is promoted by varying the gas flow rate. For example, the gas flow rate may be altered from 200 sccm per minute to 2000 sccm per minute for a duration of 30 seconds at various intervals during fiber growth. The direction of the gas flow may also be used to promote interweaving of the fibers. For example, the gas may be introduced at the side of the reactor in which the fibers are grown rather than from the center. As a result, the fibers interweave and thicken through pyrolytic deposition of carbon during the growth process, causing junctions to form between the fibers as shown in FIG. 1. The junctions which are formed as a result of the gas manipulation contribute to the continuity of the graphitic lattice structure, thus the mat becomes a continuous medium, enabling more efficient transfer of thermal energy within the mat.

The vapor grown fiber mats produced from this process are then graphitized by heat treatment in an inert gas to a temperature of 2800° C. or higher. A preform is then prepared from the resulting graphitized interwoven mats.

It should be appreciated that we have found, unexpectedly, that the graphitization (heat treatment) of the vapor grown carbon fiber mats has resulted in the improvement of the degree of graphitic perfection in the pyrolytic (matrix) carbon added during densification. This, in turn, results in a higher thermal conductivity for the resulting composite.

Densification of the vapor grown carbon fiber mat preform with pyrolytic carbon may be accomplished by conventional methods including chemical vapor infiltration and pitch infiltration. The chemical vapor infiltration process involves the pyrolysis of a hydrocarbon gas and deposition of pyrolytic carbon into the interstices of the preform. The formation of pyrolytic carbon is characterized by development of basal graphitic planes in the same method orientation as the carbon fibers. A gaseous mixture of a hydrocarbon gas and hydrogen is used for this purpose. A preferred hydrocarbon gas is methane, which preferably comprises at least 50% by volume of the mixture.

The chemical vapor infiltration process should be carried out at a temperature of from about 1000° C. to about 1100° C., and the pressure should be maintained at a range of from about 5 torr to about 100 torr. However, it should be noted that the extent of densification may be controlled by varying the gaseous precursor, composition, pressure, temperature, and time parameters.

An alternative method of densification is pitch infiltration. In this process, molten pitch from coal tar or petroleum processes is impregnated into the preform, followed by pyrolysis and subsequent re-impregnations until the pores between the fibers are filled to the point of sealing as disclosed in U.S. Pat. Nos. 4,490,201 and 4,396,663. This process results in an aligned, graphitic microstructure.

It should also be appreciated that combinations of both chemical vapor infiltration and pitch infiltration methods may be used to achieve densification of the fiber mat preform.

The resulting carbon-carbon composite may exhibit a thermal conductivity as high as 910 W/m-K after completion of only two densification cycles. Such a composite has a density of 1.88 g/cc, which is less than ⅕ that of copper (9.5 g/cc) and exhibits a thermal conductivity which is more than twice that of copper (400 W/m-K).

The carbon-carbon composites of the present invention are especially suited for use in electronic devices, experimental fusion reactors, satellites, and in aircraft and spacecraft thermal management. The carbon-carbon composites may also be deposited with a diamond film, metal layer, or other materials as disclosed in parent application Ser. No. 08/332,903, now U.S. Pat. No. 5,604,037, the disclosure of which is hereby incorporated by reference.

The following examples are for purposes of illustrating the present invention. The examples are not to be considered as limiting the scope of the claims appended hereto.

EXAMPLE 1

Carbon-carbon composites were prepared in accordance with the present invention. First, vapor grown carbon fiber mats were produced by seeding a substrate with iron particles and placing the substrate in a reactor containing a flowing gas mixture of methane and hydrogen at a temperature near 1000° C.

After removal from the reactor, mats of vapor grown carbon fibers were shaved from the substrate and cut to dimensions of about 5 cm by 30 cm. Preforms were then prepared from the fiber mats using furfuryl alcohol as a binder. The preforms were carbonized at 950° C. for 2 hours and then heated treated (graphitized) at 2800° C. for 15 minutes prior to densification.

The preforms were then densified by a chemical vapor infiltration technique at a temperature near 1050° C. utilizing a gaseous mixture of 80% $CH_4$ and 20% $H_2$. After densification, the composites were heat treated at 2800° C. for 15 minutes. A total of nine carbon-carbon composites were formed which contained either unidirectional or two-directional fiber reinforcements. The thermal conductivity, fiber volume fractions, and densities of the composites were measured, and the results are shown below in Table I.

TABLE 1

| Composite | Fiber Volume Fraction | Density (g/cc) | Thermal Conductivity (W/m-K) | Specific Conductivity (W/m-K)/(g/cc) |
|---|---|---|---|---|
| 1 | 25% | 1.26 | 326 (X) | 259 (X), 36 (Y), 12 (Z) |
| 2 | | 1.32 | 344 (X) | 261 (X) |
| 3 | | 1.51 | 372 (X) | 246 (X), 38 (Y), 16 (Z) |
| 4 | 29% | 1.15 | 362 (X) | 315 (X), 49 (Y), 12 (Z) |
| 5 | | 1.35 | 374 (X) | 277 (X), 52 (Y), 14 (Z) |
| 6 | | 1.49 | 431 (X) | 289 (X) |

TABLE 1-continued

| Composite | Fiber Volume Fraction | Density (g/cc) | Thermal Conductivity (W/m-K) | Specific Conductivity (W/m-K)/(g/cc) |
|---|---|---|---|---|
| 7 | 36% | 1.32 | 502 (X) | 380 (X) |
| 8 | | 1.48 | 528 (X) | 357 (X), 72 (Y), 18 (Z) |
| 9 | | 1.59 | 564 (X) | 355 (X), 75 (Y), 19 (Z) |

As can be seen, the carbon-carbon composites having a higher fiber volume fraction or a high density exhibit a higher thermal conductivity.

EXAMPLE 2

Vapor grown carbon fiber mat preforms were prepared as in Example 1, then various densification methods were performed on the preforms including four chemical vapor infiltration (CVI) methods (designated as CVI-0, CVI-1, CVI-2, and CVI-3) and three pitch infiltration (PI) methods (designated as PI-0, PI-1, and PI-2). The processing parameters such as precursor, composition and temperature were varied. After densification, the composites were heat treated at a temperature of about 2900° C. The fiber volume fraction of each composite was about 39%. The resulting thermal conductivity, density, and specific conductivity measurements for each composite is shown in Table II.

TABLE II

| | Densification Method | | | | | | |
|---|---|---|---|---|---|---|---|
| | Preform | CVI-0 | CVI-1 | CVI-2 | CVI-3 | PI-0 | PI-1 | PI-2 |
| Thermal Conductivity (W/m-K) | 481 | 559 | 460 | 590 | 568 | 463 | 647 | 736 |
| Density (g/cc) | 1.13 | 1.55 | 1.55 | 1.62 | 1.60 | 1.56 | 1.70 | 1.70 |
| Specific Conductivity (W/m-K) (g/cc) | 428 | 361 | 297 | 364 | 355 | 297 | 381 | 411 |

As can be seen, the pitch infiltration method results in composites with higher thermal conductivity. It can also be seen that the preform has the highest specific thermal conductivity, which indicates that the vapor grown carbon fiber mat exhibits a higher thermal conductivity than the pyrolytic (matrix) carbon.

EXAMPLE 3

Vapor grown carbon fiber mats were produced as in Example 1, but using higher fiber volume fractions. Three preforms were prepared, then densified by a pitch infiltration method. The resulting composites were then heat treated at 2900° C. The resulting composites had either unidirectional (composites A and B) or two-directional (Composite C) fiber reinforcements. The composites were measured for thermal conductivity and density, and the results are shown below in Table III.

TABLE III

| Composite | Fiber Volume Fraction (%) | Density (g/cc) | Thermal Conductivity (W/m-K) |
|---|---|---|---|
| A | 55 (X) 0 (Y) | 1.70 | 824 (X), 89 (Y), 24 (Z) |
| B | 65 (X) 0 (Y) | 1.88 | 910 (X), 84 (Y), 33 (Z) |
| C | 45 (X) 15 (Y) | 1.80 | 635 (X), 373 (Y), 21 (Z) |

As can be seen, the higher fiber volume fractions result in higher thermal conductivity. This indicates that increasing fiber loading is a more effective way of enhancing thermal conductivity than increasing the content of the pyrolytic (matrix) carbon.

EXAMPLE 4

Four vapor grown carbon fiber preforms were prepared as in Example 1. Only the preform having a volume fraction of 29% was heat-treated prior to densification. The resulting thermal conductivities and the ratio of thermal conductivity to theoretical maximum conductivity (based on rule of mixtures) is shown below in Table IV.

TABLE IV

| Composite | Fiber Volume Fraction | Theoretical Maximum Conductivity (W/m-K) | Thermal Conductivity (W/m-K | Ratio |
|---|---|---|---|---|
| 1 | 28% | 546 | 345 | 0.63 |
| 2 | 29% | 566 | 417 | 0.74 |
| 3 | 33% | 644 | 377 | 0.58 |
| 4 | 45% | 878 | 520 | 0.59 |

As can be seen, the composite produced from the heat-treated graphitized vapor grown carbon fiber mat had the highest ratio of thermal conductivity vs. theoretical maximum conductivity for its fiber volume fraction. This indicates that the highly graphitic nature of the heat-treated vapor grown carbon fiber mat also enhances the graphitic perfection of the matrix carbon.

While certain representative embodiments and details have been shown for purposes of illustrating the invention, it will be apparent to those skilled in the art that various changes in the methods and apparatus disclosed herein may be made without departing from the scope of the invention, which is defined in the appended claims.

What is claimed is:

1. A method for making a carbon-carbon composite comprising the steps of:

providing a preform including a plurality of mats, each of said mats including interwoven, graphitized vapor grown carbon fibers having randomly spaced junctions between individual fibers, said preform having interstices therein; and densifying said preform by depositing pyrolytic carbon into the interstices of said preform to produce a carbon-carbon composite, wherein said vapor grown carbon fibers are interwoven to have said randomly spaced junctions between individual fibers during in situ growth of said vapor grown carbon fibers.

2. The method of claim 1 in which said vapor grown carbon fibers are formed by flowing a gas mixture of methane and hydrogen into a reactor which has been seeded with iron particles.

3. The method of claim 2 in which said vapor grown carbon fibers become interwoven to have said functions between individual fibers by varying the gas flow rate during fiber growth and wherein said interweaving to have said junctions between individual fibers increases the transfer of thermal energy within said mat.

4. The method of claim 3 in which said interweaving to have said junctions between individual fibers is also promoted by introducing said gas flow from the side of said reactor.

5. The method of claim 1 in which said fibers have been graphitized by heat treatment at a temperature of at least 2800° C.

6. The method of claim 1 wherein said densifying step comprises a chemical vapor infiltration process.

7. The method of claim 6 wherein said chemical vapor infiltration process is carried out at a temperature range of from about 1000° C. to about 1100° C.

8. The method of claim 6 wherein said chemical vapor infiltration process is carried out at a pressure range of from about 5 torr to about 100 torr.

9. The method of claim 6 wherein said chemical vapor infiltration process uses a gaseous mixture of hydrogen gas and hydrocarbon gas, said hydrocarbon gas comprising at least 50% by volume of said mixture.

10. The method of claim 9 wherein said hydrocarbon gas is methane.

11. The method of claim 1 in which said densifying step comprises a pitch infiltration process.

* * * * *